(12) United States Patent
Zeng et al.

(10) Patent No.: US 10,783,852 B2
(45) Date of Patent: Sep. 22, 2020

(54) FLEXIBLE DISPLAY MODULE AND MANUFACTURING METHOD THEREOF

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Mu Zeng, Beijing (CN); Guowen Yang, Beijing (CN); Tao Wang, Beijing (CN); Sehyuck Park, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 71 days.

(21) Appl. No.: 15/565,868

(22) PCT Filed: Apr. 10, 2017

(86) PCT No.: PCT/CN2017/079927
§ 371 (c)(1),
(2) Date: Oct. 11, 2017

(87) PCT Pub. No.: WO2017/193743
PCT Pub. Date: Nov. 16, 2017

(65) Prior Publication Data
US 2018/0240439 A1    Aug. 23, 2018

(30) Foreign Application Priority Data

May 9, 2016    (CN) .......................... 2016 1 0301021

(51) Int. Cl.
*G09G 5/00*    (2006.01)
*G09G 5/373*    (2006.01)
(Continued)

(52) U.S. Cl.
CPC ............... *G09G 5/373* (2013.01); *G01B 7/22* (2013.01); *G01B 11/16* (2013.01);
(Continued)

(58) Field of Classification Search
None
See application file for complete search history.

(56) References Cited

U.S. PATENT DOCUMENTS 6,369,806 B1 *   4/2002   Endo .................. G06F 3/045
                                           178/18.01
7,671,849 B2 *   3/2010   Takei .................. C08G 61/126
                                           252/500
(Continued)

FOREIGN PATENT DOCUMENTS

CN        204255285 U   *   4/2015
CN        104848798 A        8/2015
(Continued)

OTHER PUBLICATIONS

Office Action received for Chinese Patent Application No. 201610301021.6, dated Feb. 12, 2018, 7 pages (4 pages of English Translation and 3 pages of Office Action).
(Continued)

*Primary Examiner* — Anh-Tuan V Nguyen
(74) *Attorney, Agent, or Firm* — Womble Bond Dickinson (US) LLP

(57) ABSTRACT

The present disclosure provides a flexible display module and a manufacturing method thereof. The flexible display module comprises a flexible display panel and a sensing module arranged on the flexible display panel. The sensing module is used for sensing a degree of bending of said flexible display panel. In this way, the flexible display module can perform corresponding operations according to the sensed degree of bending of the display panel, as a result,
(Continued)

practicability of the flexible display module can be enhanced, and the operation modes and application scenarios of the flexible screen can be expanded.

13 Claims, 3 Drawing Sheets

(51) Int. Cl.
*G01B 7/16* (2006.01)
*G01B 11/16* (2006.01)
*H01L 27/32* (2006.01)
*G06F 3/147* (2006.01)
*G06F 3/044* (2006.01)
*H01L 51/00* (2006.01)
*H01L 51/56* (2006.01)

(52) U.S. Cl.
CPC .......... *H01L 27/3227* (2013.01); *G06F 3/044* (2013.01); *G06F 3/147* (2013.01); *G09G 2330/021* (2013.01); *G09G 2340/04* (2013.01); *G09G 2370/02* (2013.01); *G09G 2380/02* (2013.01); *H01L 27/323* (2013.01); *H01L 27/3244* (2013.01); *H01L 27/3276* (2013.01); *H01L 51/0097* (2013.01); *H01L 51/56* (2013.01); *H01L 2227/323* (2013.01); *H01L 2251/5338* (2013.01)

(56) References Cited

U.S. PATENT DOCUMENTS

| | | | | |
|---|---|---|---|---|
| 9,146,638 | B2* | 9/2015 | Prushinskiy | G06F 3/0416 |
| 2002/0024656 | A1* | 2/2002 | Kwon | A61B 5/1121 |
| | | | | 356/73.1 |
| 2004/0108132 | A1* | 6/2004 | Ohazama | H05K 3/323 |
| | | | | 174/257 |
| 2006/0214925 | A1* | 9/2006 | Taninaka | G06F 3/0412 |
| | | | | 345/173 |
| 2007/0002009 | A1* | 1/2007 | Pasch | G02B 26/0841 |
| | | | | 345/108 |
| 2009/0046229 | A1* | 2/2009 | Umemoto | G02F 1/13363 |
| | | | | 349/118 |
| 2009/0278815 | A1* | 11/2009 | Li | G06F 3/045 |
| | | | | 345/174 |
| 2012/0050201 | A1* | 3/2012 | Nozawa | G06F 3/045 |
| | | | | 345/173 |
| 2012/0256720 | A1* | 10/2012 | Byun | H01C 10/10 |
| | | | | 338/2 |
| 2013/0100053 | A1* | 4/2013 | Kang | G06F 3/03 |
| | | | | 345/173 |
| 2013/0265631 | A1* | 10/2013 | Ahn | G09F 9/301 |
| | | | | 359/295 |
| 2013/0271352 | A1* | 10/2013 | Wu | G09G 5/00 |
| | | | | 345/1.1 |
| 2013/0300677 | A1* | 11/2013 | Kim | G06F 3/0414 |
| | | | | 345/173 |
| 2014/0015745 | A1 | 1/2014 | Chae et al. | |
| 2014/0049463 | A1* | 2/2014 | Seo | G06F 3/0487 |
| | | | | 345/156 |
| 2014/0055429 | A1* | 2/2014 | Kwon | G09G 3/001 |
| | | | | 345/204 |
| 2014/0055702 | A1* | 2/2014 | Park | G02F 1/136286 |
| | | | | 349/43 |
| 2014/0085230 | A1* | 3/2014 | Sato | G06F 1/1652 |
| | | | | 345/173 |
| 2015/0009129 | A1* | 1/2015 | Song | G06F 1/1652 |
| | | | | 345/156 |
| 2016/0218142 | A1* | 7/2016 | Bang | H01L 21/768 |
| 2016/0239177 | A1* | 8/2016 | Nakagawa | G06F 1/163 |
| 2016/0254328 | A1 | 9/2016 | Song | |
| 2016/0278210 | A1* | 9/2016 | Tsuruoka | H05K 1/144 |
| 2016/0378249 | A1* | 12/2016 | Miura | G06F 3/0416 |
| | | | | 345/174 |
| 2017/0040386 | A1* | 2/2017 | Miyamoto | H01L 27/323 |
| 2017/0199712 | A1* | 7/2017 | Lee | G01B 7/22 |
| 2017/0271293 | A1* | 9/2017 | Heo | H05K 1/118 |
| 2018/0137801 | A1* | 5/2018 | An | G06F 3/013 |

FOREIGN PATENT DOCUMENTS

| | | |
|---|---|---|
| CN | 105446616 A | 1/2016 |
| CN | 105487734 A | 4/2016 |
| CN | 105955534 A | 9/2016 |

OTHER PUBLICATIONS

International Search Report and Written Opinion in PCT/CN2017/079927 dated Jun. 28, 2017, with English translation.
Office Action in Chinese Application No. 201610301021.6 dated Jul. 31, 2017, with English translation.

\* cited by examiner

FLEXIBLE DISPLAY MODULE AND MANUFACTURING METHOD THEREOF

RELATED APPLICATION

The present application is the U.S. national phase entry of PCT/CN2017/079927, with an international filling date of Apr. 10, 2017, which claims the benefit of priority from the Chinese application No. 201610301021.6 filed on May 9, 2016, the disclosure of which is incorporated herein by reference.

TECHNICAL FIELD

The present disclosure relates to the technical field of display, in particular to a flexible display module and manufacturing method thereof.

BACKGROUND

A flexible display device is manufactured using flexible substrates, and usually the Active Matrix Organic Light Emitting Diode (AMOLED) or Polymer Light-Emitting Diode (PLED) technology is employed. Flexible display devices have many advantages such as low power consumption, direct visualization, being deformable, bendable, light and thin, impact resistant and highly durable, and they can be mounted on curved surfaces to be made into wearable displays, etc., so they are expected to become the mainstream in the field of display.

SUMMARY

An object of the present disclosure is to provide a flexible display module that can sense a bending degree thereof.

In view of the above object, the present disclosure provides a flexible display module and a manufacturing method thereof.

In an aspect, an embodiment of the present disclosure provides a flexible display module comprising a flexible display panel, the flexible display panel is provided with a sensing module for sensing a degree of bending of the flexible display panel.

In an embodiment, the sensing module comprises a first line film and a second line film arranged on a non-display surface of the flexible display panel, and conductive particles between the first line film and the second line film, the first line film is between the second line film and the flexible display panel. Each of the first line film and the second line film includes several wires that are insulated from one another.

In an embodiment, orthographic projections of wires in the second line film onto the first line film form a mesh shape together with wires in the first line film.

Further, in an embodiment, a shrinkage rate of the first line film is greater than a shrinkage rate of the second line film.

In an embodiment, the conductive particles are adhered to the first line film.

Further, there may be a spacing between the first line film and the second line film, so that the conductive particles on the first line film do not contact the second line film when the flexible display panel is not bent, and that at least part of the conductive particles on the first line film contact the second line film when the flexible display panel is bent.

In another embodiment, the sensing module further comprises a first scanning circuit electrically connected to the first line film and the second line film, the first scanning circuit is used for performing scanning for the first line film and the second line film so as to determine a region in which the first line film and the second line film contact with each other through the conductive particles, thereby determining the degree of bending of the flexible display panel based on the determined region.

In another embodiment, the sensing module comprises a capacitive touch substrate on a display surface of the flexible display panel and a second scanning circuit connected to the capacitive touch substrate, the second scanning circuit is used for determining the degree of bending of the flexible display panel based on a capacitance in the capacitive touch substrate.

In yet another embodiment, the sensing module comprises an optical fiber bending displacement sensor disposed on the flexible display panel and an optical signal processing circuit. The optical signal processing circuit is used for determining the degree of bending of the flexible display panel based on light propagation parameters sensed by the optical fiber bending displacement sensor.

Further, the optical fiber bending displacement sensor comprises an optical fiber as well as a light emitter and a light receiver at the two ends of the optical fiber.

In yet another embodiment, the sensing module comprises a thin film pressure sensor provided on the flexible display panel and a pressure signal processing circuit electrically connected to the thin film pressure sensor. The pressure signal processing circuit is used for determining the degree of bending of the flexible display panel based on a pressure change sensed by the thin film pressure sensor.

In any one of the above embodiments, the flexible display module may further comprise a control module, and the sensing module provides a signal indicating a sensed degree of bending of the flexible display panel to the control module, the control module is used for triggering the flexible display module to perform corresponding operations according to the degree of bending of the flexible display panel.

In some embodiments, the control module triggering the flexible display module to perform corresponding operations according to the degree of bending of the flexible display panel includes: the control module triggering the flexible display module to be switched to a display mode adapted to a current bending degree according to the degree of bending of the flexible display panel.

In some embodiments, the control module triggering the flexible display module to be switched to a display mode adapted to a current bending degree according to the degree of bending of the flexible display panel includes: triggering the flexible display module to be switched to a sleep mode when a part of the flexible display panel bends 180 degrees towards the display surface.

In some embodiments, the control module triggering the flexible display module to be switched to a display mode adapted to a current bending degree according to the degree of bending of the flexible display panel includes: triggering the flexible display module to be switched to a partial screen display mode when a part of the flexible display panel bends 180 degrees towards the non-display surface.

In some embodiments, the control module triggering the flexible display module to perform corresponding operations according to the degree of bending of the flexible display panel includes: triggering the flexible display module to turn off a network function when a part of the flexible display panel bends 180 degrees towards the display surface.

The present disclosure further provides a method for manufacturing a flexible display module, the method comprising providing a sensing module to a flexible display panel for sensing a degree of bending of the flexible display panel.

Further, the method may further comprise providing a control module to receive, from the sensing module, a signal indicating the degree of bending of the flexible display panel as sensed by the sensing module, and to trigger the flexible display module to perform corresponding operations according to the degree of bending of the flexible display panel.

BRIEF DESCRIPTION OF DRAWINGS

The features and advantages of the present disclosure can be more clearly understood with reference to the drawings. The drawings are schematic but they shall not be construed as limiting the invention in any way. In the drawings.

DETAILED DESCRIPTION OF EMBODIMENTS

In order to facilitate a better understanding to the objective, features and advantages of the present disclosure, embodiments of the present disclosure will be described in further detail below with reference to the drawings and specific example implementations. It shall be noted that embodiments of the present disclosure and features in the embodiments can be combined as long as no conflict occurs.

Many details are depicted in the description below to facilitate full understanding of the present disclosure, but the invention can also be implemented in other ways than those described herein, so the scope of the invention is not limited by the embodiments disclosed below.

According to an aspect, the present disclosure provides a flexible display module, which comprises a flexible display panel and a sensing module attached to the flexible display panel. The sensing module is used to sense a degree of bending of the flexible display panel. Therefore, a flexible display module is provided whose degree of bending can be sensed, and it becomes possible to enable the flexible display module to perform corresponding operations according to the sensed degree of bending, thereby enhancing practicability of the flexible display module and expanding the operation modes and application scenarios of the flexible device.

In practice, the sensing module in the flexible display module provided in the present disclosure can be implemented in different ways, and several examples of implementations will be described below. Obviously, the descriptions of the sensing module given below are merely some examples of the sensing module, while the possible implementations of the sensing module are not limited to these examples.

Figure 1:
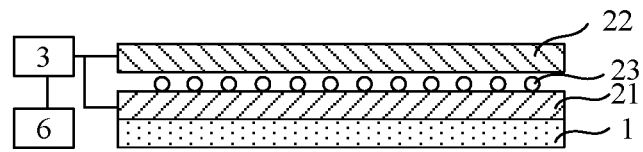
FIG. 1 is a structural schematic diagram of a flexible display module provided in an embodiment of the present disclosure.

Referring to FIG. 1, in an embodiment, the sensing module comprises a first line film 21 and a second line film 22 arranged on a non-display surface (in FIG. 1, assuming that the non-display surface is an upper surface of a flexible display pane 1) of a flexible display panel 1, and conductive particles 23 between the first line film 21 and the second line film 22. The first line film 21 is between the second line film 22 and the flexible display panel 1. In this embodiment, both the first line film and the second line film may include several wires that are insulated from one another. Since the first line film and the second line film each includes multiple wires, when the flexible display panel is bent, some of the wires in the first line film can be electrically connected to some of the wires in the second line film via conductive particles, thus a degree of bending of the flexible display panel can be judged on the basis of numbers of the wires in the first line film and wires in the second line film that are electrically connected via the conductive particles. For example, larger numbers of wires in the first line film and the second line film that are electrically connected via conductive particles means a higher degree of bending of the flexible display panel. Otherwise, it may mean that the flexible display panel has a low degree of bending.

Figure 2:
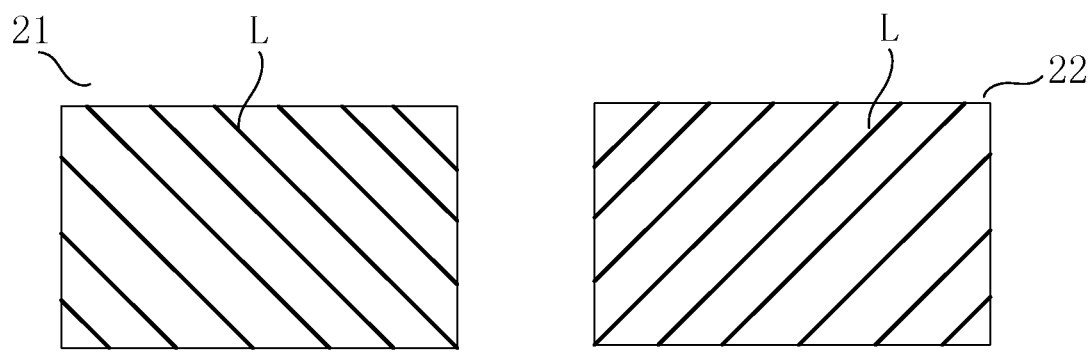
FIG. 2 is a structural schematic diagram of a sensing module as shown in FIG. 1.

In an embodiment, orthographic projections of wires in the second line film onto the first line film can form a mesh shape together with wires in the first line film. As shown in FIG. 2, both the first line film and the second line film include several wires L parallel to one another, and an extension direction of the wires L in the second line film 22 is different from an extension direction of the wires in the first line film 21, in this way, orthographic projections of the wires L in the second line film 22 onto the first line film 21 can form a mesh shape together with the wires L in the first line film 21. When the flexible display panel is bent, the first line film and the second line film will bend with the flexible display panel, and by means of the first line film and second line film provided in this embodiment, the probability of electrical connection between the wires in the first line film and the second line film via the conductive particles owing to bending of the flexible display panel can be increased, thereby increasing accuracy of sensing of the degree of bending of the flexible display panel.

In an embodiment, the conductive particles 23 may be adhered to the first line film 21, when the flexible display panel 1 is not bent, the conductive particles 23 do not contact the second line film 22. A shrinkage rate of the first line film 21 can be greater than a shrinkage rate of the second line film 22.

As shown in FIG. 1, there is a certain spacing between the first line film 21 and the second line film 22, so that the conductive particles 23 on the first line film 21 do not contact the second line film 22 when the flexible display panel is not bent, and that at least part of the conductive particles on the first line film contact the second line film when the flexible display panel is bent. In other words, when the flexible display panel is bent, an area of a region in which the first line film 21 is connected to the second line film 22 via the conductive particles 23 may be depend on the degree of bending of the flexible display panel.

In addition, in another embodiment, the sensing module may further comprise a first scanning circuit 3 electrically connected to the first line film 21 and the second line film 22. The first scanning circuit 3 is used for performing scanning for the first line film 21 and the second line film 22 so as to determine a region in which the first line film 21 and the second line film 22 contact with each other through the conductive particles, thereby determining a degree of bending of the flexible display panel according to the determined region. For example, the region in which the first line film 21 and the second line film 22 contact with each other through the conductive particles may vary with different degrees of bending of the flexible display panel. When it is determined that the region in which the first line film 21 and the second line film 22 contact with each other through the conductive particles has a large area, it can be determined that the flexible display panel has a high degree of bending.

The shrinkage rate of the first line film 21 is greater than the shrinkage rate of the second line film 22, so when the flexible display panel is bent, contact and electrical connection between the first line film 21 and the second line film 22 through the conductive particles 23 can be more easily realized. The first scanning circuit 3 can perform scanning to the wires in the first line film 21 and the second line film 22, and determine the region in which the first line film 21 and the second line film 22 are electrically connected via the conductive particles based on a detected change of levels on the wires. For example, a high-level scanning pulse can be applied to each of the wires in the first line film 21 sequentially, and it is detected whether a level of each of the wires in the second line film 22 has changed. When a wire in the first line film 21, which is electrically connected to a corresponding wire in the second line film 22, is scanned, a level of said corresponding wire in the second line film 22 will be pulled up. Therefore, when such a level change is detected, it can be determined that an electrical connection occurs at an interface between the wire of the first line film 21 which is being scanned and the wire of the second line film 22 which is being detected, accordingly, the region in which said electrical connection occurs can be determined, and the degree of bending of the flexible display panel 1 can be determined based on the determined region.

As for the first line film and the second line film mentioned in this embodiment, they may include a carrier made of flexible insulating materials, respectively, and the wires L shown in FIG. 2 can be disposed on a surface of the carrier made of flexible insulating materials.

Figure 3:
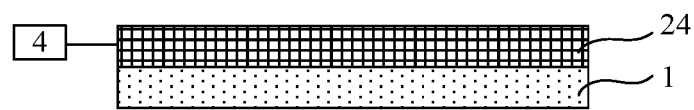
FIG. 3 is a structural schematic diagram of a flexible display module provided in another embodiment of the present disclosure.

Although not shown in FIG. 1, those skilled in the art can understand that the second line film 22 may be coupled or fixed to other components of the flexible display module, such as a frame structure that is made of a flexible material. Referring to FIG. 3, in an alternative embodiment, the sensing module comprises a capacitive touch substrate 24 on a display surface of the flexible display panel 1 as well as a second scanning circuit 4 connected to the capacitive touch substrate 24, the second scanning circuit 4 being used for determining a degree of bending of the flexible display panel 1 according to a capacitance in the capacitive touch substrate 24.

Figure 4:
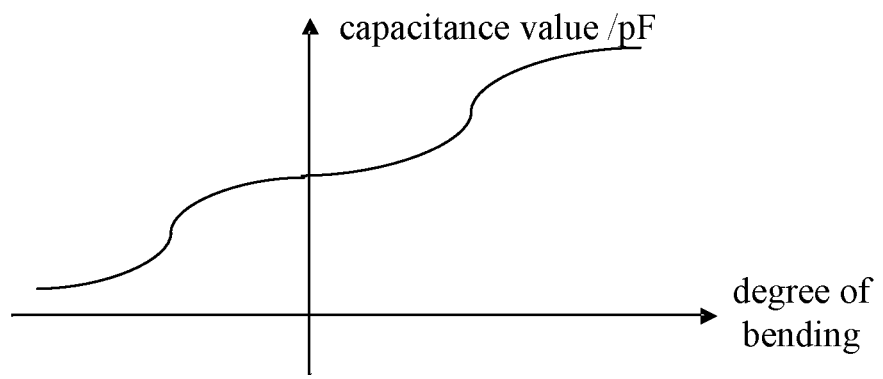
FIG. 4 shows an example of the relationship between a capacitance value in the capacitive touch substrate and a degree of bending of the flexible display panel corresponding to the embodiment shown in FIG. 3.

Specifically, there is a certain relationship between a capacitance value in the capacitive touch substrate 24 and the degree of bending of the flexible display panel 1, for example, it may be the curve as shown in FIG. 4. Thus the second scanning circuit 4 can determine the degree of bending of the flexible display panel 1 according to the detected capacitance value in the capacitive touch substrate 24.

Figure 5:
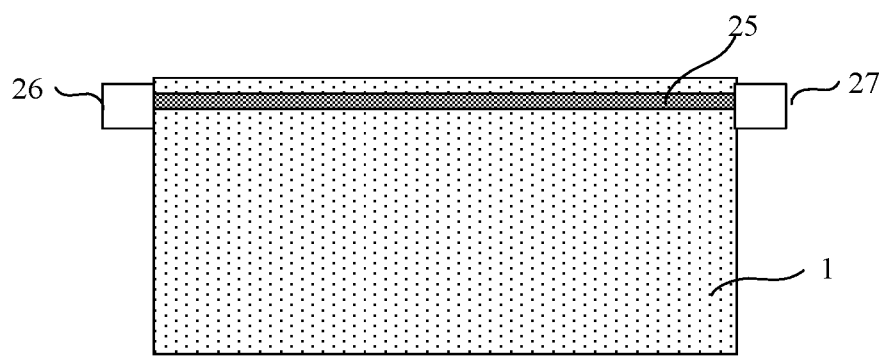
FIG. 5 is a structural schematic diagram of a flexible display module provided in still another embodiment of the present disclosure.

Referring to FIG. 5, in another embodiment, the sensing module comprises an optical fiber bending displacement sensor 25 (that includes an optical fiber, and a light emitter 26 and a light receiver 27 at the two ends of the optical fiber) on the flexible display panel 1 and an optical signal processing circuit (not shown in FIG. 5). The optical signal processing circuit is used for determining a degree of bending of the flexible display panel 1 according to light propagation parameters sensed by the optical fiber bending displacement sensor.

In an embodiment, the optical fiber bending displacement sensor can be arranged on a non-display surface of the flexible display panel 1, and when the flexible display panel 1 is bent, the optical fiber bending displacement sensor changes correspondingly in shape, and total reflection angles of light rays in the optical fiber also change, resulting in a change of displacement of light rays passing through the optical fiber bending displacement sensor. The optical signal processing circuit can determine a current degree of bending of the optical fiber based on parameters of time and displacement of the light rays passing through the optical fiber bending displacement sensor 25, thereby determining the degree of bending of the flexible display panel 1. Although FIG. 5 does not show the optical signal processing circuit, those skilled in the art shall understand that the optical signal processing circuit can be connected or coupled to the optical fiber bending displacement sensor 25 in any proper manner, as long as the optical signal processing circuit can receive and sense the light rays passing through the optical fiber bending displacement sensor.

Figure 6:
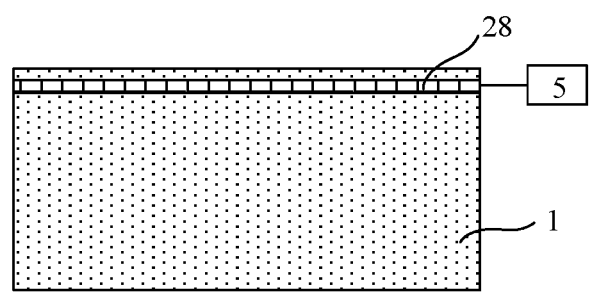
FIG. 6 is a structural schematic diagram of a flexible display module provided in yet another embodiment of the present disclosure.

Referring to FIG. 6, in another alternative embodiment, the sensing module comprises a thin film pressure sensor 28 provided on the flexible display panel 1 and a pressure signal processing circuit 5 electrically connected to the thin film pressure sensor. The pressure signal processing circuit is used for determining a degree of bending of the flexible display panel according to a pressure change sensed by the thin film pressure sensor.

In the embodiment, the thin film pressure sensor 28 can also be arranged on the non-display surface of the flexible display panel 1. When the flexible display panel 1 is bent, the thin film pressure sensor 28 can sense a pressure change on the flexible display panel 1 caused by deformation resulted from bending and extrusion, and the pressure signal processing circuit can determine the degree of bending of the flexible display panel 1 based on said pressure change.

It shall be understood that, for any of the above embodiments, no matter which one of the listed example implementations will be selected to realize the sensing module, implementation of the entire solution will not be influenced. Accordingly, the basic object of the invention can be achieved by any embodiment resulted from combining the different implementations of the sensing module, and the technical solutions obtained from the combinations shall fall into the protection scope of the invention.

On the basis of sensing the degree of bending of the flexible display panel by the sensing module, the flexible display module provided in the present disclosure may further comprise a control module (e.g. a control module 6 shown in FIG. 1), and the sensing module can provide a signal indicating the sensed degree of bending of the flexible display panel to the control module, and the control module may perform corresponding operations according to the degree of bending of the flexible display panel, thereby enhancing practicability of the flexible display module and expanding the operation mode and application scenarios the flexible screen. For example, the control module can trigger the flexible display module to be switched to a display mode adapted to the current degree of bending of the flexible display panel according to the degree of bending of the flexible display panel. For instance, the control module may trigger the flexible display module to be switched to a sleep mode to save power when a part of the flexible display panel 1 bends 180 degrees towards the display surface; and/or trigger the flexible display module to be switched to a partial screen display mode (e.g. a half screen display mode) when a part of the flexible display panel 1 bends 180 degrees towards the non-display surface so as to realize switching between large and small display screens. Additionally or alternatively, in the case of a customized bending of the flexible display panel 1, contents displayed by the flexible display panel may be adjusted automatically according to the degree of bending, thereby expanding the application scenarios of the flexible display module. By way of example, the flexible display module may be a flexible flat panel display device, and a part of the flexible display panel bending 180 degrees towards the display surface thereof may mean that the screen of the flat panel display device is folded, and the display surfaces of the two parts of flexible display panel obtained by the folding face each other, namely, the user no longer attends to or does not need to look at the display screen of the flat panel display device at the time, and the flat panel display device can therefore be controlled to be in a sleep mode so as to save power. A part of the flexible display panel bending 180 degrees towards the non-display surface thereof may mean that the screen of the flexible display module is folded, and the display surfaces of the two parts of flexible display panels obtained by the folding face away from each other, and the display surface of any of the two parts of flexible display panel can be presented to the user. Therefore, the flexible display module can be triggered to be switched to a partial screen display mode (e.g. a half screen display mode) at the time, so as to realize switching between large and small display screens.

Figure 7:
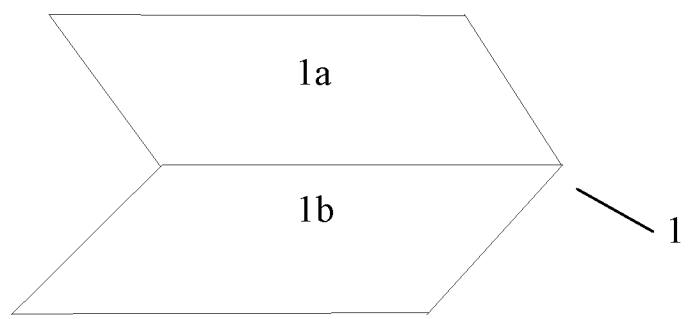
FIG. 7 illustrating a part 1a of a flexible display panel 1 bending a certain degree (smaller than 180°) towards a display surface thereof to form a first part 1a and a second part 1b.

FIG. 7 illustrates a part 1a of the flexible display panel 1 bending a certain degree (smaller than 180°) towards a display surface thereof to form a first part 1a and a second part 1b. It can be appreciated that if the part 1a of the flexible display panel 1 continues to bend towards the display surface thereof to reach 180 degrees, the display surfaces of the two parts 1a and 1b obtained by folding will overlap each other, namely, the user no longer attends to or does not need to look at the display screen of the flat panel display device at the time, and the flat panel display device can therefore be controlled to be in a sleep mode so as to save power. In addition, the control module can also be used to trigger the flexible display module to perform a series of other operations than displaying according to the degree of bending of the flexible display panel. For example, when the flexible display panel 1 bends 180 degrees towards the display surface, the control module can not only trigger the flexible display module to be switched to the sleep mode, but also trigger the flexible display module to turn off the network function at the same time, thereby saving both power and data traffic. In case the flexible display module is a communication device like a mobile phone, when the flexible display panel 1 bends 180 degrees towards the non-display surface, the control module can not only be used to trigger the flexible display module to be switched to a half screen display mode, but also be used to trigger the mobile phone to answer the current incoming call, etc., thereby expanding the operation modes of the flexible display module.

The control module triggering the flexible display module to perform corresponding operations as described above merely involves several exemplary embodiments of the present disclosure. It shall be understood that all technical solutions of triggering the flexible display module to perform corresponding operations according to the degree of bending of the flexible display module shall fall into the protection scope of the invention.

In another aspect, the present disclosure further provides a manufacturing method for a flexible display module, which comprises providing a sensing module on a flexible display panel, the sensing module being used for sensing a degree of bending of the flexible display panel.

Further, the manufacturing method further comprises providing a control module that receives, from the sensing module, a signal indicating a degree of bending of the flexible display panel as sensed by the sensing module, and triggers the flexible display module to perform corresponding operations according to the degree of bending of the flexible display panel.

The flexible display module manufactured by means of the manufacturing method for a flexible display module as provided by the present disclosure can be enabled to perform corresponding operations according to the sensed degree of bending of the flexible display panel, thereby enhancing practicability of the flexible display module and expanding the operation mode and application scenarios of the flexible screen.

It is easy to understand that as the structures of the flexible display modules to be manufactured are different, the specific embodiments of the manufacturing method may also be different. In order to manufacture a flexible display module of a corresponding structure, those skilled in the art can think of properly adjusting the manufacturing method for a flexible display module as provided by the present disclosure, so the methods obtained from adjustment shall fall within the protection scope of the present invention.

Although embodiments of the present disclosure are described with reference to the drawings, those skilled in the art can make various modifications and variations to the embodiments without departing from the spirit and scope of the invention, so these modifications and variations shall fall into the scope defined by the appended claims.

The invention claimed is:

1. A flexible display module comprising a flexible display panel, wherein the flexible display panel comprises a sensing module for sensing a degree of bending of the flexible display panel,
wherein the sensing module comprises:
a first line film and a second line film arranged on a non-display surface of the flexible display panel, each of the first line film and the second line film comprising a plurality of wires insulated from one another, and
a plurality of conductive particles between the first line film and the second line film,
wherein the first line film is between the second line film and the flexible display panel,
wherein the plurality of conductive particles are adhered to a surface of the first line film and in contact with the plurality of wires of the first line film, and the plurality of conductive particles are spaced apart from each other on the surface of the first line film,
wherein there is a spacing between the first line film and the second line film, so that the plurality of conductive particles do not contact the second line film when the flexible display panel is not bent, and that at least part of the plurality of conductive particles contact the second line film when the flexible display panel is bent.

2. The flexible display module according to claim 1, wherein orthographic projections of the wires in the second line film onto the first line film form a mesh shape together with the wires in the first line film.

3. The flexible display module according to claim 2, wherein a shrinkage rate of the first line film is greater than a shrinkage rate of the second line film.

4. The flexible display module according to claim 3, wherein the sensing module further comprises a first scanning circuit electrically connected to the first line film and the second line film, the first scanning circuit is used for performing scanning for the first line film and the second line film so as to determine a region in which the first line film and the second line film contact with each other through the at least part of the plurality of conductive particles, thereby determining the degree of bending of the flexible display panel based on the determined region.

5. The flexible display module according to claim 1, wherein the sensing module further comprises a thin film pressure sensor provided on the flexible display panel and a pressure signal processing circuit electrically connected to the thin film pressure sensor,
wherein the pressure signal processing circuit is used for determining the degree of bending of the flexible display panel based on a pressure change sensed by the thin film pressure sensor.

6. The flexible display module according to claim 1, wherein the flexible display module further comprises a processor, and the sensing module provides a signal indicating a sensed degree of bending of the flexible display panel to the processor, the processor is used for triggering the flexible display module to perform corresponding operations according to the degree of bending of the flexible display panel.

7. The flexible display module according to claim 6, wherein the processor triggering the flexible display module to perform corresponding operations according to the degree of bending of the flexible display panel includes: the processor triggering the flexible display module to be switched to a display mode adapted to a current bending degree according to the degree of bending of the flexible display panel.

8. The flexible display module according to claim 7, wherein the processor triggering the flexible display module to be switched to a display mode adapted to a current bending degree according to the degree of bending of the flexible display panel includes: triggering the flexible display module to be switched to a sleep mode when a part of the flexible display panel bends 180 degrees towards the display surface.

9. The flexible display module according to claim 7, wherein the processor triggering the flexible display module to be switched to a display mode adapted to a current bending degree according to the degree of bending of the flexible display panel includes: triggering the flexible display module to be switched to a partial screen display mode when a part of the flexible display panel bends 180 degrees towards the non-display surface.

10. The flexible display module according to claim 6, wherein the processor triggering the flexible display module to perform corresponding operations according to the degree of bending of the flexible display panel includes: triggering the flexible display module to turn off a network function when a part of the flexible display panel bends 180 degrees towards the display surface.

11. A flexible display module comprising a flexible display panel, wherein the flexible display panel comprises a sensing module for sensing a degree of bending of the flexible display panel,
wherein the sensing module comprises:
a first line film and a second line film arranged on a non-display surface of the flexible display panel, each of the first line film and the second line film comprising a plurality of wires insulated from one another, and
a plurality of conductive particles between the first line film and the second line film,
wherein the first line film is between the second line film and the flexible display panel,
wherein the plurality of conductive particles are adhered to a surface of the first line film and in contact with the plurality of wires of the first line film, and the plurality of conductive particles are spaced apart from each other on the surface of the first line film,
wherein there is a spacing between the first line film and the second line film, so that the plurality of conductive particles do not contact the second line film when the flexible display panel is not bent, and that at least part of the plurality of conductive particles contact the second line film when the flexible display panel is bent,
wherein the sensing module further comprises a capacitive touch substrate on a display surface of the flexible display panel and a second scanning circuit connected to the capacitive touch substrate, wherein the second scanning circuit is used for determining the degree of bending of the flexible display panel based on a capacitance in the capacitive touch substrate.

12. A flexible display module comprising a flexible display panel, wherein the flexible display panel comprises a sensing module for sensing a degree of bending of the flexible display panel,
wherein the sensing module comprises:
a first line film and a second line film arranged on a non-display surface of the flexible display panel, each of the first line film and the second line film comprising a plurality of wires insulated from one another, and
a plurality of conductive particles between the first line film and the second line film,
wherein the first line film is between the second line film and the flexible display panel,
wherein the plurality of conductive particles are adhered to a surface of the first line film and in contact with the plurality of wires of the first line film, and the plurality of conductive particles are spaced apart from each other on the surface of the first line film,
wherein there is a spacing between the first line film and the second line film, so that the plurality of conductive particles do not contact the second line film when the flexible display panel is not bent, and that at least part of the plurality of conductive particles contact the second line film when the flexible display panel is bent,
wherein the sensing module further comprises an optical fiber bending displacement sensor disposed on the flexible display panel and an optical signal processing circuit,
wherein the optical signal processing circuit is used for determining the degree of bending of the flexible display panel based on light propagation parameters sensed by the optical fiber bending displacement sensor.

13. The flexible display module according to claim 12, wherein the optical fiber bending displacement sensor comprises an optical fiber as well as a light emitter and a light receiver at the two ends of the optical fiber.

\* \* \* \* \*